United States Patent
Jang et al.

(10) Patent No.: US 11,183,464 B2
(45) Date of Patent: Nov. 23, 2021

(54) PACKAGE SUBSTRATE PROCESSING METHOD AND PROTECTIVE TAPE

(71) Applicant: DISCO CORPORATION, Tokyo (JP)

(72) Inventors: Byeongdeck Jang, Tokyo (JP); Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 21 days.

(21) Appl. No.: 16/149,201

(22) Filed: Oct. 2, 2018

(65) Prior Publication Data

US 2019/0109094 A1   Apr. 11, 2019

(30) Foreign Application Priority Data

Oct. 5, 2017   (JP) .............................. JP2017-194993

(51) Int. Cl.
| | | |
|---|---|---|
| *H01L 23/552* | (2006.01) | |
| *H01L 23/31* | (2006.01) | |
| *H01L 23/498* | (2006.01) | |
| *H01L 21/56* | (2006.01) | |
| *H01L 21/683* | (2006.01) | |

(Continued)

(52) U.S. Cl.
CPC .......... *H01L 23/552* (2013.01); *H01L 21/561* (2013.01); *H01L 21/565* (2013.01); *H01L 21/6836* (2013.01); *H01L 21/78* (2013.01); *H01L 23/3107* (2013.01); *H01L 23/3128* (2013.01); *H01L 23/49838* (2013.01); *H01L 24/48* (2013.01); *H01L 2221/68327* (2013.01); *H01L 2221/68331* (2013.01); *H01L 2224/48091* (2013.01); *H01L 2224/48225* (2013.01); *H01L 2224/48227* (2013.01); *H01L 2924/00014* (2013.01); *H01L 2924/15156* (2013.01); *H01L 2924/15311* (2013.01);

(Continued)

(58) Field of Classification Search
None
See application file for complete search history.

(56) References Cited

U.S. PATENT DOCUMENTS

| | | | |
|---|---|---|---|
| 5,857,974 A * | 1/1999 | Eberle .................. | A61B 1/0011 29/25.35 |
| 2006/0219359 A1* | 10/2006 | Miyamoto ........ | H01L 21/67132 156/716 |

(Continued)

FOREIGN PATENT DOCUMENTS

JP   2012039104 A   2/2012

*Primary Examiner* — Anthony Ho
*Assistant Examiner* — Kevin Quinto
(74) *Attorney, Agent, or Firm* — Greer, Burns & Crain, Ltd.

(57) ABSTRACT

A package substrate processing method for processing a package substrate in which a plurality of semiconductor chips on a wiring substrate are collectively sealed with a sealing agent is provided. In the package substrate processing method, a protective tape is adhered to the wiring substrate side of the package substrate, the package substrate is divided into a plurality of semiconductor packages, and a shield layer is formed on an upper surface and side surfaces of each package. In this instance, the package substrate is divided in a state in which adhesiveness of an adhesive layer of the protective tape in the periphery of the package substrate is reduced or eliminated, whereby adhesion of a metallic powder scattering at the time of the dividing to the adhesive layer of the protective tape is restrained.

14 Claims, 9 Drawing Sheets

(51) Int. Cl.
*H01L 21/78* (2006.01)
*H01L 23/00* (2006.01)

(52) U.S. Cl.
CPC .................. *H01L 2924/181* (2013.01); *H01L 2924/1815* (2013.01); *H01L 2924/3025* (2013.01)

(56) References Cited

U.S. PATENT DOCUMENTS

| | | | |
|---|---|---|---|
| 2008/0315376 A1* | 12/2008 | Tang | H01L 23/552 257/660 |
| 2012/0300412 A1* | 11/2012 | Song | H01L 24/97 361/728 |
| 2014/0190513 A1* | 7/2014 | Lee | H01L 21/67766 134/1.2 |
| 2016/0099218 A1* | 4/2016 | Lee | H01L 24/97 438/113 |
| 2017/0179098 A1* | 6/2017 | Yoo | H01L 21/565 |

* cited by examiner

PACKAGE SUBSTRATE PROCESSING METHOD AND PROTECTIVE TAPE

BACKGROUND OF THE INVENTION

Field of the Invention

The present invention relates to a package substrate processing method and a protective tape.

Description of the Related Art

In general, a semiconductor package for use in portable communication apparatuses such as mobile phones is required to restrain leakage of electromagnetic noises to the exterior, for preventing bad influences on communication characteristics. Therefore, it is necessary to provide the semiconductor package with a shield function. As a semiconductor package having a shield function, there has been known one in which a semiconductor chip mounted on an interposer substrate is sealed with a sealing agent, and a shield layer is formed along an outer surface of the sealing agent layer. As a method for forming the shield layer, there have been proposed a sputtering method, a spraying method, a chemical vapor deposition (CVD) method, an ink jet method, a screen printing method and the like (see, for example, Japanese Patent Laid-Open No. 2012-039104).

SUMMARY OF THE INVENTION

Meanwhile, a package substrate is processed on a protective tape (dicing tape) along division lines (streets), to be thereby divided into individual semiconductor packages. In this instance, processing swarf on an upper surface of the package substrate is removed by cleaning. Since the processing swarf is adhering also to an adhesive layer of the protective tape, however, the processing swarf may be left on the protective tape. Since the processing swarf contains a metallic powder of a metal wiring or the like, there is a problem that if a plasma treatment such as sputtering is started in a state in which the metallic powder is left on the protective tape, abnormal electric discharge would be generated, hampering the formation of the shield layer and lowering the quality.

It is therefore an object of the present invention to provide a package substrate processing method by which it is possible to restrain adhesion of a metallic powder to a protective tape and to prevent generation of abnormal electric discharge in a plasma treatment, and a protective tape.

In accordance with an aspect of the present invention, there is provided a package substrate processing method for processing a package substrate having a plurality of chips in regions partitioned by intersecting division lines formed on a wiring substrate, the chips collectively sealed with a sealing agent. The package substrate processing method includes a package substrate supporting step of adhering a protective tape to the wiring substrate side of the package substrate and supporting a peripheral portion of the protective tape by an annular frame, a dividing step of cutting in to an intermediate portion of the protective tape by a dividing tool, processing the package substrate along the division lines, and dividing the package substrate into individual semiconductor packages, after the package substrate supporting step is performed, and a shield layer forming step of forming a conductive shield layer on a sealing agent upper surface and side walls of each of the plurality of semiconductor packages, after the dividing step is performed. In the dividing step, processing is conducted by the dividing tool in a state in which adhesiveness of an adhesive layer of the protective tape in a periphery of the package substrate is reduced or eliminated, whereby adhesion of a metallic powder of the wiring substrate scattering at the time of the dividing to the adhesive layer of the protective tape is reduced.

According to this configuration, since the adhesiveness of the protective tape in the periphery of the package substrate is reduced or eliminated, it is ensured that even when a metallic powder of the wiring substrate or the like scatters at the time of dividing the semiconductor package, adhesion of the metallic powder to the protective tape in the periphery of the package substrate is reduced. At the time of forming a shield layer by a plasma treatment, generation of abnormal electric discharge due to the metallic powder left on the protective tape is restrained. Therefore, there is no possibility that the formation of the shield layer might be hampered by abnormal electric discharge, and the shield layer can be formed favorably.

In the package substrate processing method according to the described aspect, the protective tape may have the adhesive layer, and the package substrate processing method may further include an ultraviolet (UV) ray applying step of applying UV rays to the adhesive tape exposed in the periphery of the package substrate, to reduce adhesion of the metallic powder to the adhesive layer of the protective tape in the periphery of the package substrate, between the package substrate supporting step and the dividing step.

In the package substrate processing method according to the described aspect, the protective tape may have the adhesive layer only at parts to be adhered to the package substrate and the annular frame in the periphery.

The package substrate processing method according to the described aspect may further includes a water-soluble resin applying step of applying a water-soluble resin in such a manner as to cover at least an entire surface of the adhesive layer of the protective tape in the periphery of the package substrate, between the package substrate supporting step and the dividing step, and a water-soluble resin removing step of removing the water-soluble resin, after the dividing step is performed.

The package substrate processing method according to the described aspect may further include a V-groove forming step of holding the protective tape side of the package substrate by a chuck table, causing a cutting blade having a V-shaped tip to cut from the sealing agent side to an intermediate position in a thickness direction of the package substrate, to cut the package substrate along regions corresponding to the division lines, thereby forming V-grooves such as to each have inclined side surfaces from an upper surface of the sealing agent to a bottom of each cut groove, between the package substrate supporting step and the dividing step.

In accordance with another aspect of the present invention, there is provided a protective tape for use in processing a package substrate having a plurality of chips disposed in regions partitioned by intersecting division lines formed on a wiring substrate, the chips collectively sealed with a sealing agent. The protective tape includes a tape base material, an adhesive region is provided on an upper surface of the tape base material at a peripheral portion to be supported by an annular frame and at a central portion to which a package substrate is to be adhered, and a non-adhesive region is provided on the upper surface of the tape base material at other position than the peripheral portion and the central portion, the protective tape having resistance to plasma processing.

According to the present invention, it is possible, by reducing or eliminating the adhesiveness of the protective tape in the periphery of the package substrate, to restrain abnormal electric discharge due to the metallic powder at the time of forming the shield layer by the plasma treatment, and to form the shield layer favorably.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
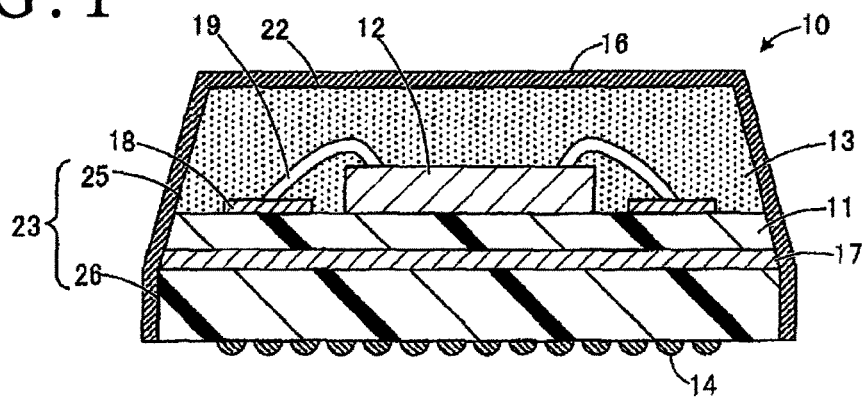
FIG. 1 is a schematic sectional view of a semiconductor package according to an embodiment of the present invention.
Figure 2A:
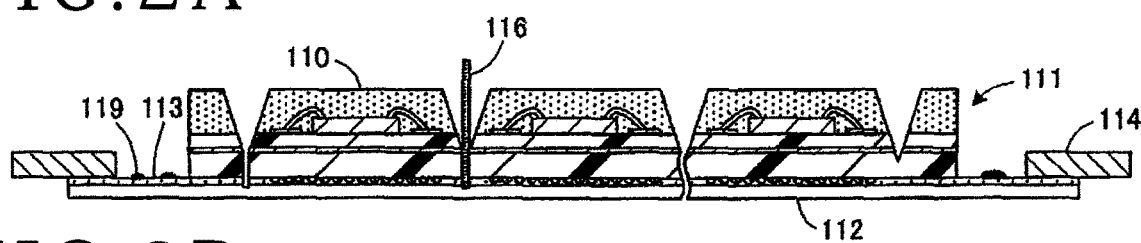
FIGS. 2A, 2B, and 2C are illustrations of a semiconductor package manufacturing method of a comparative example.
Figure 2B:
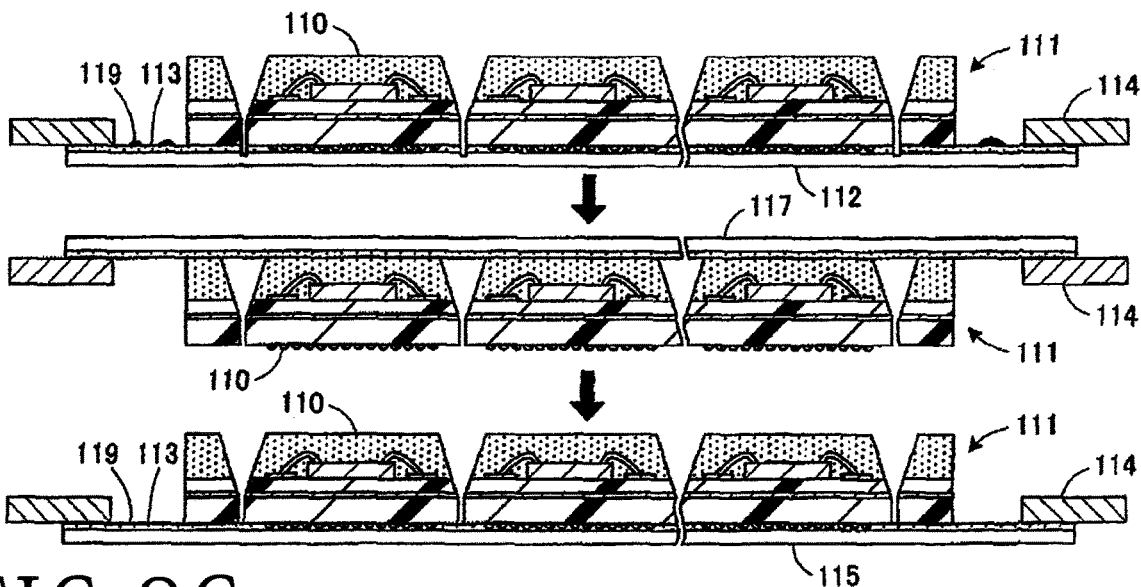
Figure 2C:
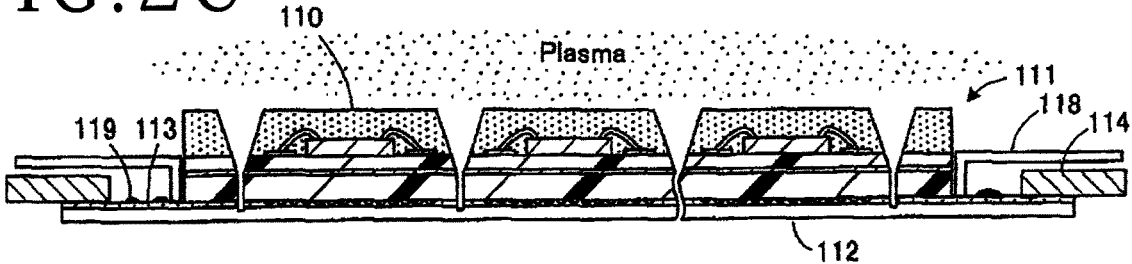

A package substrate processing method according to the present embodiment will be described below, referring to the attached drawings. FIG. 1 is a schematic sectional view of a semiconductor package in the present embodiment. FIGS. 2A, 2B, and 2C are illustrations of a semiconductor package manufacturing method according to a comparative example. Note that the following embodiment merely depicts an example, other step or steps may be provided between the steps, and the order of the steps may be changed as required.

As illustrated in FIG. 1, a semiconductor package 10 is an example of a packaged semiconductor apparatus requiring shielding due to so-called electro-magnetic interference (EMI), and is configured to restrain leakage of electromagnetic noises to the surroundings by a shield layer 16 at an outer surface. On the inside of the shield layer 16, a semiconductor chip (chip) 12 mounted on an upper surface of a wiring board (wiring substrate) 11 is sealed with a resin layer (sealing agent) 13, and bumps 14 are disposed on a lower surface of the wiring board 11. The wiring board 11 is formed with various wirings including electrodes and a ground line 17 which are connected to the semiconductor chip 12.

The semiconductor chip 12 is formed by individualizing a semiconductor wafer on the basis of each device on the semiconductor substrate, and is mounted at a predetermined position on the wiring board 11. At a package side surface (side wall) 23, there is formed an inclined surface 25 such as to extend downward from a package upper surface (sealing agent upper surface) 22 toward the outside, and the shield layer 16 is formed on the inclined surface 25 from above by a sputtering method or the like. Unlike a vertical package side surface of a general semiconductor package, the inclined surface 25 of the package side surface 23 intersects obliquely a forming direction of the shield layer 16, and, therefore, the shield layer 16 can be easily formed on the inclined surface 25.

Meanwhile, as depicted in the comparative example in FIG. 2A, a package substrate 111 is supported by an annular frame 114 through a protective tape 112, and the package substrate 111 is divided into individual semiconductor packages 110 by dicing by a cutting blade 116 or the like. Since a normal protective tape 112 has an adhesive layer 113 provided on the entire surface thereof, a metallic powder 119 scattered at the time of cutting the package substrate ill adheres to the adhesive layer 113 of the protective tape 112. While a metallic powder on the package substrate 111 can be removed by blowing of cleaning water during processing or by a cleaning treatment after the processing, the metallic powder 119 adhered to the adhesive layer 113 of the protective tape 112 cannot be removed sufficiently.

Where the metallic powder 119 is left on the protective tape 112, there arises a problem that when the shield layer is formed on the semiconductor packages 110, a film forming treatment is hampered by abnormal electric discharge at the time of a plasma treatment, and the film forming quality is lowered. Furthermore, since a normal protective tape 112 is not resistant to plasma, the same tape cannot be used at the time of dividing the package substrate 111 and at the time of the plasma treatment. For this reason, the protective tape 112 for the dividing and a protective tape 115 (see FIG. 2B) for the plasma treatment are individually prepared, and tape replacement is conducted between the time of dividing the package substrate 111 and the time of the plasma treatment, whereby abnormal electric discharge at the time of the plasma treatment is prevented and deterioration of the tape is restrained.

As illustrated in FIG. 2B, in the case of replacing the protective tape 112 with the protective tape 115 on the back surface of the semiconductor package 110, it is necessary to adhere a further protective tape 117 to the front surface of the semiconductor package 110, and to perform the replacement of the protective tape in two divided steps. Therefore, tape cost is increased, and the increase in the number of times of replacement (the number of times of transfer) would change the package interval of the semiconductor packages 110. In addition, as depicted in FIG. 2C, abnormal electric discharge can be prevented by masking the periphery of the package substrate 111 in a chamber at the time of the plasma treatment, but the size of a mask 118 must be changed on the basis of the package substrate 111.

In view of this, in the present embodiment, in order that a series of treatments from the dividing of the package substrate 15 to the plasma treatment can be carried out while using the same protective tape, the dividing is carried out in a state in which adhesion of a metallic powder to the protective tape is restrained, and a protective tape excellent in resistance to the plasma treatment is adopted. By restraining of the adhesion of the metallic powder to the protective tape, abnormal electric discharge due to the plasma treatment is restrained, and the resistance of the protective tape to the plasma treatment restrains deterioration of the protective tape due to the plasma treatment. In addition, since a tape replacing operation is not needed, tape cost is reduced, and the package interval is prevented from being changed.

Here, as the method for reducing the adhesiveness of the protective tape in the periphery of the package substrate 15, there have been investigated three methods, namely, a UV irradiation method, a special tape using method, and a soft mask forming method. The UV irradiation method is a method wherein UV rays are applied to a protective tape 30 with the package substrate 15 as a mask, thereby reducing the adhesion of the metallic powder to the adhesive layer in the periphery of the package substrate 15 (see FIG. 4A). The special tape using method is a method wherein a special protective tape (special tape) 50 not having an adhesive layer in the periphery of the package substrate 15 is used (see FIGS. 6A to 6D). The soft mask forming method is a method wherein a water-soluble resin is applied to the periphery of the package substrate 15 to form a soft mask 64 on the protective tape 60, thereby eliminating the adhesiveness in situ (see FIGS. 7A to 7C).

Figure 3A:
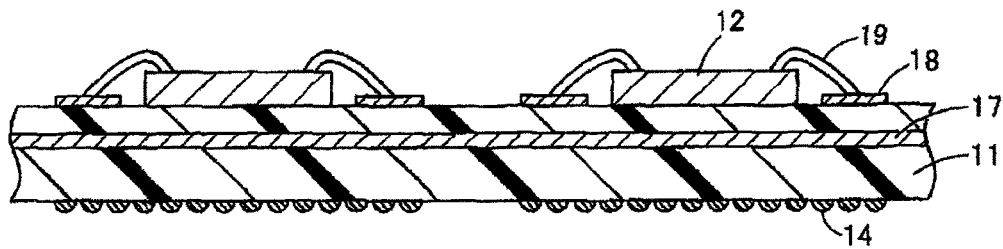
FIGS. 3A, 3B, and 3C are illustrations of a first package substrate processing method.
Figure 3B:
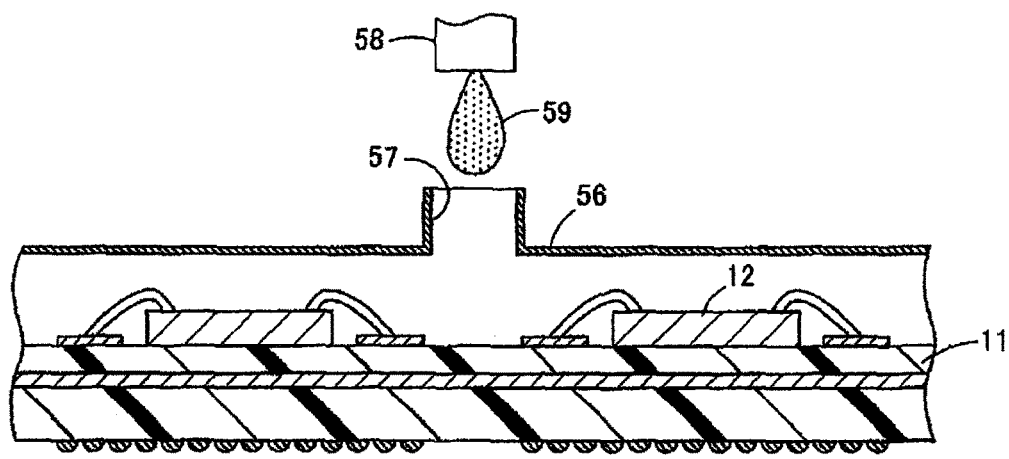
Figure 3C:
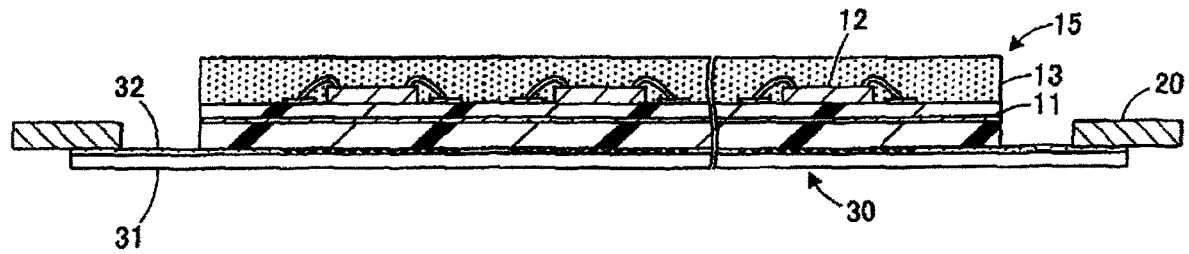
Figure 4A:
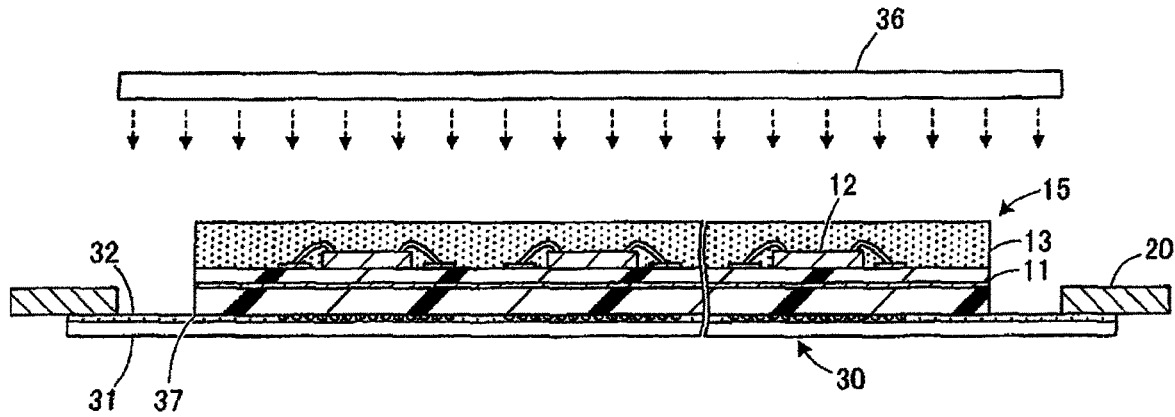
FIGS. 4A, 4B, and 4C are illustrations of the first package substrate processing method.
Figure 4B:
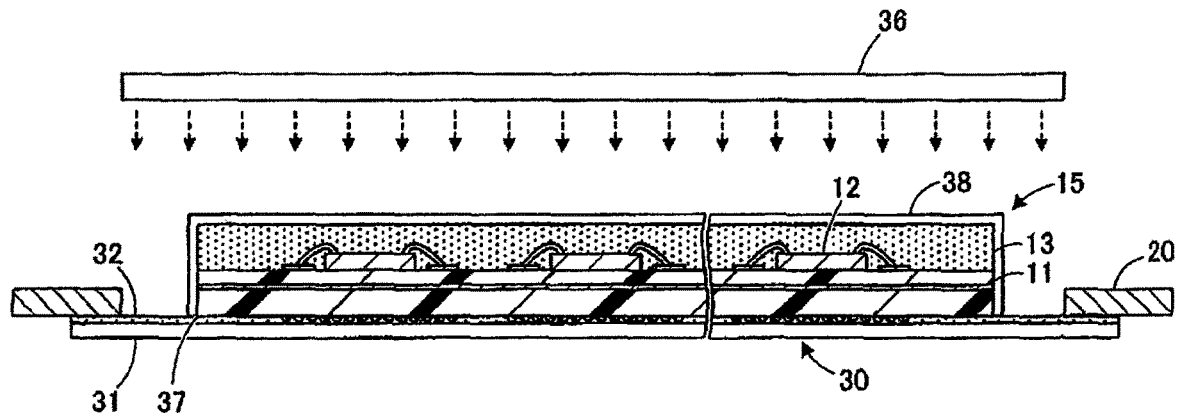
Figure 4C:
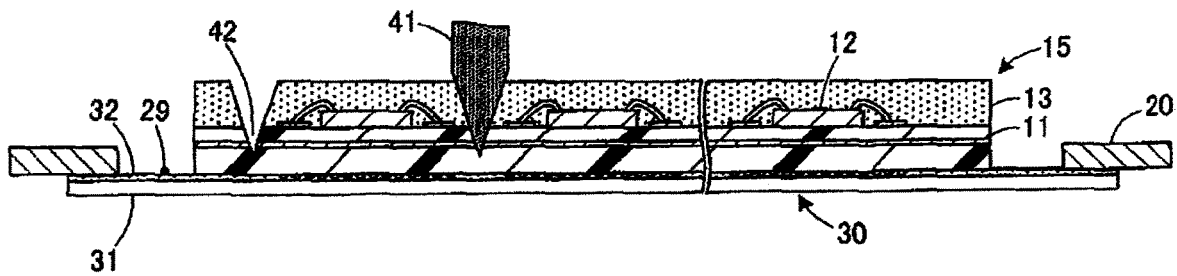
Figure 5A:
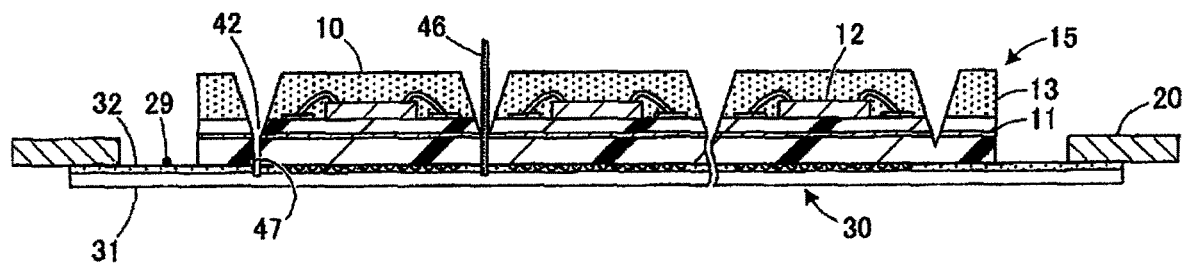
FIGS. 5A, 5B, and 5C are illustrations of the first package substrate processing method.
Figure 5B:
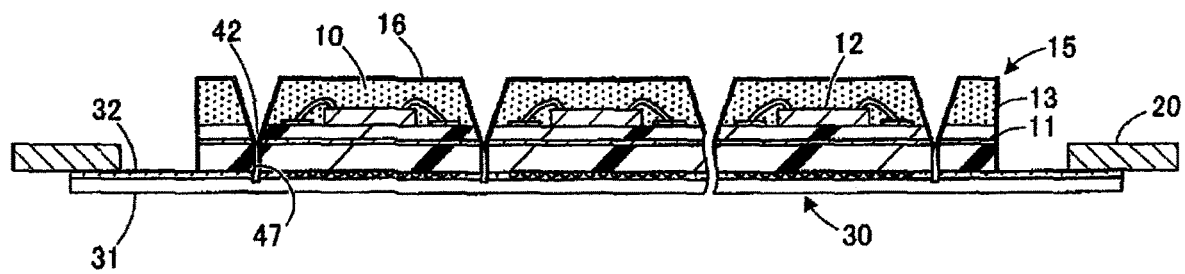
Figure 5C:
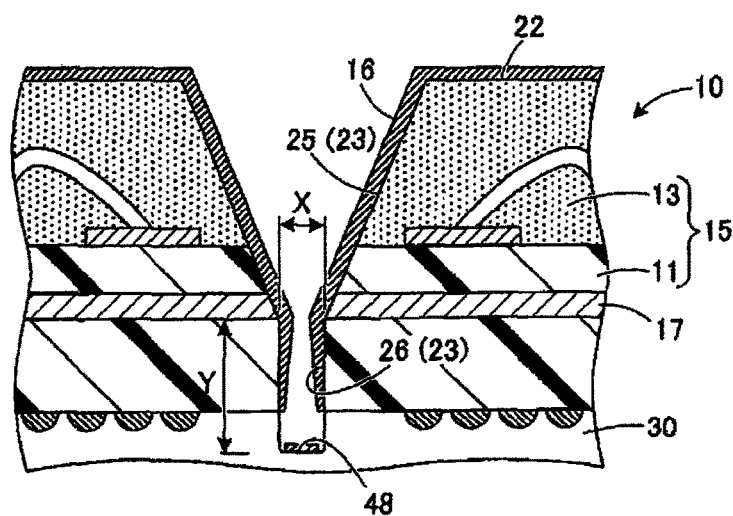

First, referring to FIGS. 3A to 5C, a first processing method in which the UV irradiation method is adopted will be described. FIGS. 3A to 5C are illustrations of a first package substrate processing method. Note that FIG. 3A depicts an example of a mounting step, FIG. 3B illustrates an example of a substrate forming step, and FIG. 3C depicts an example of a package substrate supporting step. FIGS. 4A and 4B depict an example of a UV ray application step, and FIG. 4C illustrates an example of a V-groove forming step. FIG. 5A depicts an example of a dividing step, and FIGS. 5B and 5C depict an example of a shield layer forming step.

As illustrated in FIG. 3A, a mounting step is first conducted. In the mounting step, a front surface of the wiring board 11 is partitioned by intersecting division lines in a grid pattern, and a plurality of semiconductor chips 12 are individually disposed in the plurality of partitioned regions. The wiring board 11 is formed therein with wirings such as the ground line 17, and the bumps 14 are disposed on a lower surface of the wiring board 11. In this case, one end of a wire 19 is connected to an electrode on the upper surface of the semiconductor chip 12, and the other end of the wire 19 is connected to an electrode 18 on a front surface of the wiring board 11. Note that the wire bonding is not restrictive; flip-chip bonding may be carried out wherein electrodes on the lower surface of the semiconductor chip 12 are connected directly to electrodes on the front surface of the wiring board 11.

After the mounting step is performed, a substrate forming step is carried out, as depicted in FIG. 3B. In the substrate forming step, a sealing agent 59 is supplied to the front surface side of the wiring board 11 on which the plurality of semiconductor chips 12 are mounted, and the semiconductor chips 12 are collectively sealed with the sealing agent 59, to form the package substrate 15 (see FIG. 3C). In this case, the lower surface of the wiring board 11, on which the semiconductor chips 12 are mounted, is held by a holding jig (not depicted), and a mold 56 is disposed in such a manner as to cover the upper surface of the wiring board 11. An injection port 57 is opened in an upper wall of the mold 56, and a supply nozzle 58 for supplying the sealing agent 59 is positioned on the upper side of the injection port 57.

The sealing agent 59 is supplied from the supply nozzle 58 to an upper surface of the wiring board 11 through the injection port 57, to seal the semiconductor chips 12. In this state, the sealing agent 59 is cured by heating or drying, whereby the package substrate 15 having the resin layer 13 (see FIG. 3C) on the upper surface of the wiring board 11 is formed. Note that as the sealing agent 59, there is used a curable material, which may be selected from epoxy resins, silicone resins, urethane resins, unsaturated polyester resins, acryl-urethane resins, polyimide resins, and the like. In addition, as the sealing agent 59, not only liquid resins but also sheet-shaped or powdery resins may be used. In this way, the plurality of semiconductor chips 12 on the wiring board 11 are collectively sealed. Note that in the case where the package substrate 15 is prepared in advance, the mounting step and the substrate forming step may be omitted.

After the substrate forming step is conducted, a package substrate supporting step is carried out, as illustrated in FIG. 3C. In the package substrate supporting step, a protective tape 30 is adhered in such a manner as to close the center of an annular frame 20, and the wiring board 11 side of the package substrate 15 is adhered to the protective tape 30. This results in that an outer peripheral portion of the protective tape 30 is supported by the annular frame 20, and the package substrate 15 is positioned on the inside of the annular frame 20 through the protective tape 30. The protective tape 30 is a so-called dicing tape, which is formed by laminating an adhesive layer 32 on an upper surface of a tape base material 31. Note that as the adhesive layer 32, a UV-curing type adhesive layer may be used, or an adhesive layer of other type than the UV-curing type may be used.

Note that the protective tape 30 as a whole is preferably formed from a material which has resistance to a plasma treatment in a shield layer forming step to be carried out subsequently. The resistance to a plasma treatment means resistance to plasma, inclusive of plasma resistance, heat resistance, and vacuum resistance. The tape base material 31 of the protective tape 30 is preferably formed from a material having a heat resisting temperature of 150 to 170 degrees, which material may be selected from among polyethylene naphthalate resin and polyimide resins, for example. The annular frame 20 may be formed in a ring shape in plan view, or may be formed in a rectangular frame shape in plan view. Besides, the package substrate supporting step may be mechanically carried out by a special-purpose apparatus such as a mounter, or may be manually carried out by an operator.

After the package substrate supporting step is performed, a UV ray application step is carried out, as depicted in FIG. 4A. In the UV ray application step, a high pressure mercury lamp is used as a light source 36 in the case where the adhesive layer 32 of the protective tape 30 is of the UV curing type. The light source 36 is positioned on the upper side of the package substrate 15, and UV rays of a wavelength of 350 nm are applied from the light source 36 toward the adhesive layer 32 of the protective tape 30. In this instance, the UV rays are shielded by the package substrate 15 and the annular frame 20, and the UV rays are applied to the adhesive layer 32 exposed in the periphery of the package substrate 15 (a region surrounding the periphery of the package substrate 15). Curing of the adhesive layer 32 in the periphery of the package substrate 15 reduces the adhesiveness of the adhesive layer 32, whereby adhesion of a metallic powder 29 (see FIG. 4C) to the adhesive layer 32 of the protective tape 30 at the time of dividing the package substrate 15 is restrained.

Thus, with the package substrate 15 and the annular frame 20 functioning as a mask, the adhesiveness of the exposed part of the adhesive layer 32 can only be reduced, without reducing the adhesiveness of the adhesive layer 32 for the package substrate 15 and the annular frame 20. The application amount of the UV rays need not be so large as to completely cure the adhesive layer 32 of the protective tape 30, and need only partly lower the adhesiveness of at least the surface of the adhesive layer 32 of the protective tape 30. The configuration wherein the application of the UV rays to the adhesive layer 32 of the protective layer 30 is conducted at a time is not restrictive, and the application may be carried out in two steps, one before the dividing of the package substrate 15 and one after the dividing.

In addition, in the UV ray application step, a low pressure mercury lamp is used as the light source 36 in the case where the adhesive layer 32 of the protective tape 30 is of other type than the UV curing type. In this case, UV rays of a wavelength of approximately 185 nm and UV rays of a wavelength of approximately 254 nm are simultaneously applied from the light source 36 toward the adhesive layer 32 of the protective tape 30. The UV rays of a wavelength of approximately 185 nm decomposes oxygen molecules in air into oxygen atoms, and the oxygen atoms are combined together to form ozone. Further, the UV rays of a wavelength of approximately 254 nm decomposes ozone, to generate active oxygen in an excited state. The active oxygen combines with water-repellent contaminants, whereby the water-repellent contaminants are turned into $H_2O$, $CO_2$ and the like and evaporated, whereby wettability of the adhesive layer 32 is enhanced. Besides, on the surface of the adhesive layer 32, molecule combinations are decomposed by the application of UV rays, and the active oxygen in the surroundings of the surface combines with the surface, whereby the surface of the adhesive layer 32 is modified to be hydrophilic. Since the water-repellent contaminants are removed from the surface of the adhesive layer 32 and the surface of the adhesive layer 32 is modified to be hydrophilic, adhesion of the metallic powder 29 to the adhesive layer 32 of the protective tape 30 at the time of dividing the package substrate 15 is restrained.

Besides, in the UV application step, the UV rays may be applied to the adhesive layer 32 on the front side from the back side of the protective tape 30. In this case, a mask is provided on the back side of the protective tape 30 in such a manner that the UV rays are not applied to adhesion surfaces of the package substrate 15 and the annular frame 20. In such a configuration, also, the adhesion of the metallic powder 29 to the adhesive layer 32 can be reduced, through curing of the adhesive layer 32 and modification of the surface of the adhesive layer 32 to be hydrophilic.

Note that when the UV rays enter through a lower edge 37 of the package substrate 15, adhesiveness at the lower edge 37 may be lowered, and floating may be generated at a peripheral portion of the package substrate 15. In this case, the UV rays may be applied in two steps, one before dividing of the package substrate 15 and one after the dividing as above-mentioned, and the amount of the UV rays applied in the first step may be suppressed to such a level that the floating will not be generated at the peripheral portion of the package substrate 15. In addition, entering of the UV rays through the peripheral portion of the package substrate 15 may be prevented by masking the package substrate 15 as a whole by a hard mask 38, as depicted in FIG. 4B. Note that the hard mask is not particularly limited in regard of material, provided that the UV rays can be shielded thereby.

After the UV ray application step is conducted, a V-groove forming step is carried out, as depicted in FIG. 4C. In the V-groove forming step, there is used a cutting blade which is formed by binding diamond abrasive grains or the like with a binder and is formed in a circular disk shape having a V-shaped tip (the cutting blade will hereinafter be referred to as V-blade 41). The wiring board 11 side of the package substrate 15 is held by a chuck table (not depicted) through the protective tape 30, and the V-blade 41 is aligned to a division line on the package substrate 15. On the outside of the package substrate 15, the V-blade 41 is lowered to an intermediate depth in the thickness direction of the package substrate 15, and horizontal cutting feeding of the package substrate 15 relative to the V-blade 41 is conducted.

The V-blade 41 is made to cut into the package substrate 15 from the resin layer (sealing agent) 13 side to an intermediate position in the thickness direction of the package substrate 15, and the package substrate 15 is half cut along a region corresponding to the division line. As a result, a V-groove 42 is formed such as to have side walls inclined from the upper surface of the resin layer 13 to a bottom of the cut groove. In this instance, since the V-blade 41 cuts in to the wiring board 11, a metallic powder 29 of wiring and the like scatters even onto the protective tape 30 in the surroundings of the package substrate 15. Since the adhesiveness of the adhesive layer 32 of the protective tape 30 in the surroundings of the package substrate 15 has been lowered, adhesion of the metallic powder 29 to the adhesive layer 32 hardly occurs, and the metallic powder 29 is easily removed by jetting of cutting water during processing or by cleaning after the processing.

Figure 14:
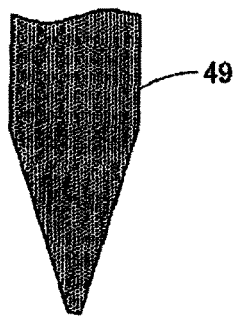
FIG. 14 is a figure depicting a modification of a V-blade.

Note that while the tip of the V-blade 41 is V-shaped in the present embodiment, this configuration is not limitative. The tip of the V-blade 41 may be any shape that can form the package substrate 15 with the V-grooves 42. For example, as depicted in FIG. 14, the tip of the V-blade 49 may be formed in a V-shape with a flat tip. Thus, the V-shape of the tip of the cutting blade is not limited to a perfect V-shape pointed up to the tip of the cutting blade, but means shapes inclusive of a substantially V-shape with the tip of the cutting blade being flat. In addition, the V-shaped surfaces of the tip of the V-blade need not be inclined rectilinearly, but may be slightly rounded.

After the V-groove forming step is performed, a dividing step is carried out, as depicted in FIG. 5A. In the dividing step, there is used a cutting blade which is formed by binding diamond abrasive grains or the like with a binder, is smaller in width than the V-blade 41, and is formed in a circular disk shape with a rectangular tip (this cutting blade will hereinafter be referred to as straight blade 46 (dividing tool)). The straight blade 46 is aligned to the V-groove 42 of the package substrate 15 on a chuck table. On the outside of the package substrate 15, the straight blade 46 is lowered to an intermediate depth in the thickness direction of the protective tape 30, and cutting feeding of the package substrate 15 relative to the straight blade 46 is conducted.

The straight blade 46 is made to cut into the package substrate 15 to an intermediate position of the protective tape 30, whereby the package substrate 15 is fully cut along the division line. As a result, rectangular grooves 47 are formed from the groove bottoms of the V-grooves 42 toward the protective tape 30, and the package substrate 15 is divided into individual semiconductor packages 10. In this instance, a metallic powder 29 of wiring and the like scatters even onto the protective tape 30 in the surroundings of the package substrate 15. Since the adhesive layer 32 of the protective tape 30 in the surroundings of the package substrate 15 has been lowered in adhesiveness, adhesion of the metallic powder 29 to the adhesive layer 32 hardly occurs, and the metallic powder 29 is easily removed by jetting of cutting water during processing or by cleaning after the processing.

After the dividing step is performed, a shield layer forming step is carried out, as illustrated in FIG. 5B. In the shield layer forming step, a shield layer 16 is formed from a conductive material on package outer surfaces of the plurality of semiconductor packages 10. In this case, each semiconductor package 10 is carried into a plasma apparatus (not depicted) together with the protective tape 30, and a film of a conductive material is formed on each semiconductor package 10 from above by a plasma treatment such as sputtering under predetermined forming conditions. As a result, the shield layer 16 is formed in a desired thickness on the package outer surface of each semiconductor package 10.

In this instance, as depicted in FIG. 5C, inclined surfaces 25 of package side surfaces 23 are spreading outward in going downward from the package upper surface 22, and the inclined surfaces 25 intersect obliquely a forming direction of the shield layer 16 (vertical direction). Therefore, at the time of forming the shield layer 16 on the semiconductor package 10, the shield layer 16 is formed in such a thickness as to be able to exhibit a sufficient shielding effect, not only on the package upper surface 22 but also on the inclined surfaces 25 of the package side surfaces 23. In addition, since the metallic powder 29 is not left on the protective tape 30 (see FIG. 5B), abnormal electric discharge would not occur at the time of the plasma treatment. Further, since the protective tape 30 has resistance to the plasma treatment, the protective tape 30 would not be deteriorated due to the plasma treatment.

In addition, since the shield layer 16 is formed also on vertical surfaces 26 of the package side surfaces 23 and on groove bottoms 48 between the packages, burring due to the shield layer 16 may be generated at a lower portion of the semiconductor package 10 at the time of picking up the semiconductor package 10 from the protective tape 30. In this case, generation of burring of the semiconductor package 10 can be restrained by controlling the aspect ratio (vertical/horizontal ratio) between the packages as well as film forming conditions for the shield layer 16. The aspect ratio between the packages can be controlled by the width size and the cutting-in amount of the straight blade 46 (see FIG. 5A).

The aspect ratio between packages is represented by Y/X, where Y mm is the depth from the lower end of the inclined surface 25 of the package side surface 23 to the groove bottom 48 of the groove cut in the protective tape 30, and X mm is the interval between the vertical surfaces 26 of the package side surfaces 23. The lower side of the vertical surfaces 26 of the package side surfaces 23 and the groove bottoms 48 between the packages are liable to be influenced by the aspect ratio, and the shield layer 16 there becomes thinner as the aspect ratio increases. With the aspect ratio enhanced, the shield layer 16 is formed in an appropriate thickness on the inclined surfaces 25 hardly influenced by the aspect ratio, while the shield layer 16 is formed to be thin on the lower side of the vertical surfaces 26 and the groove bottoms 48 liable to be influenced by the aspect ratio, so that generation of burrs is restrained.

Besides, the ground line 17 of the wiring board 11 is exposed to the exterior at the lower side of the inclined surfaces 25 of the package side surfaces 23. Since the ground line 17 is connected to the shield layer 16 in an appropriate thickness at the lower side of the inclined surfaces 25, electromagnetic noises generated in the semiconductor package 10 are released to the exterior of the semiconductor package 10 through the ground line 17. Note that although the shield layer 16 becomes thinner at the lower side of the vertical surfaces 26 of the package side surfaces 23, electromagnetic noises are cut there by a multiplicity of wirings (not depicted) of the wiring board 11. Therefore, leakage of electromagnetic noises to electronic parts in the surroundings of the semiconductor package 10 is prevented as a whole.

Note that the ground line 17 of the wiring board 11 need only be connected to the shield layer 16, and may be connected to the shield layer 16 at the vertical surfaces 26 of the package side surfaces 23. In addition, the shield layer 16 is a metallic layer of a thickness of not less than several micrometers which is formed from at least one conductive material selected from among copper, titanium, nickel, gold and the like, and may be formed by a plasma treatment such as a sputtering method, an ion plating method, and a plasma-enhanced CVD method. In this way, a semiconductor package 10 wherein the package upper surface 22 and the package side surfaces 23 are covered with the shield layer 16 is manufactured.

Thus, in the first processing method, UV rays are applied to the protective tape 30 with the package substrate 15 and the annular frame 20 as a mask, whereby the adhesiveness of the exposed part of the protective tape 30 is reduced. Therefore, adhesion of the metallic powder 29 to the protective tape 30 can be restrained in the V-groove forming step and the dividing step, and abnormal electric discharge can be prevented in the shield layer forming step. In addition, since the protective tape 30 has resistance to a plasma treatment, the protective tape 30 can be restrained from being deteriorated in the shield layer forming step. The same protective tape 30 can be used in the series of treatments in the processing method for the package substrate 15, and, therefore, tape cost is reduced, and the package interval is prevented from being changed.

Now, referring to FIGS. 6A to 6D, a second processing method in which a special tape using method is used will be described below. The second processing method differs from the first processing method only in that a special protective tape (special tape) wherein an adhesive layer is absent in the surroundings of the package substrate is used as the protective tape instead of conducting the UV ray application step. Therefore, other steps than the UV ray application step are the same as in the first processing method; therefore, the descriptions of the other steps will be omitted, and the protective tape constituting the different point will be described. FIGS. 6A, 6B, 6C, and 6D are illustrations of the second package substrate processing method.

Figure 6A:
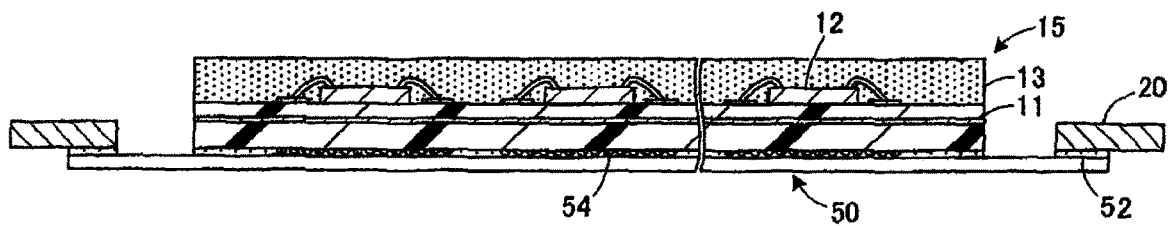
FIGS. 6A, 6B, 6C, and 6D are illustrations of a second package substrate processing method.

As illustrated in FIG. 6A, in the second processing method, a special protective tape (special tape) 50 having adhesive layers 52 and 54 only at parts to be adhered to the package substrate 15 and the annular frame 20 is used as the protective tape. The protective tape 50 has resistance to a plasma treatment, and deterioration of the tape in the shield layer forming step is restrained. On an upper surface of a tape base material 51, the adhesive layer 52 is provided at an outer peripheral part to be supported by the annular frame 20, and the adhesive layer 54 is provided at a central part to which the package substrate 15 is to be adhered, whereas the adhesive layer is not provided at an exposed part between the annular frame 20 and the package substrate 15. Therefore, even when the metallic powder 29 is scattered onto the surroundings of the package substrate 15, the metallic powder 29 hardly adheres to the protective tape 50, and the metallic powder 29 is easily removed by jetting of cutting water during processing or by cleaning after the processing.

Figure 6B:
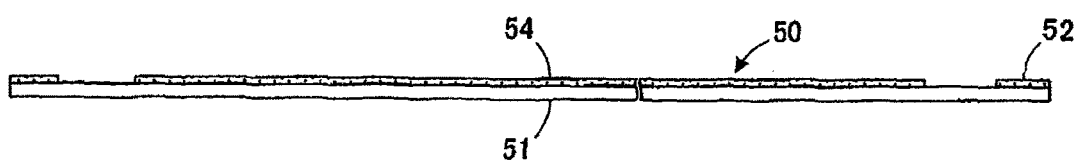
Figure 6C:
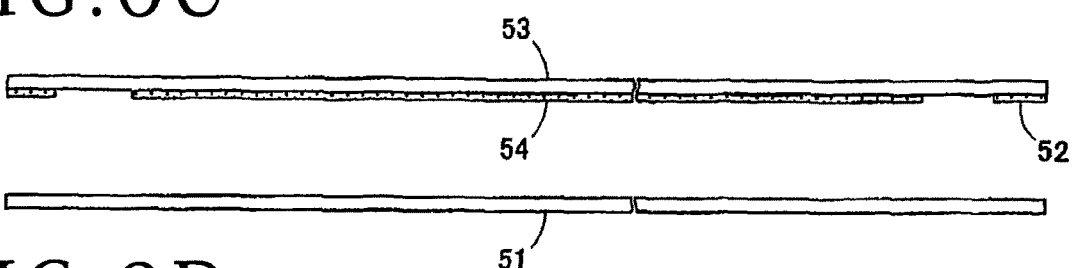
Figure 6D:
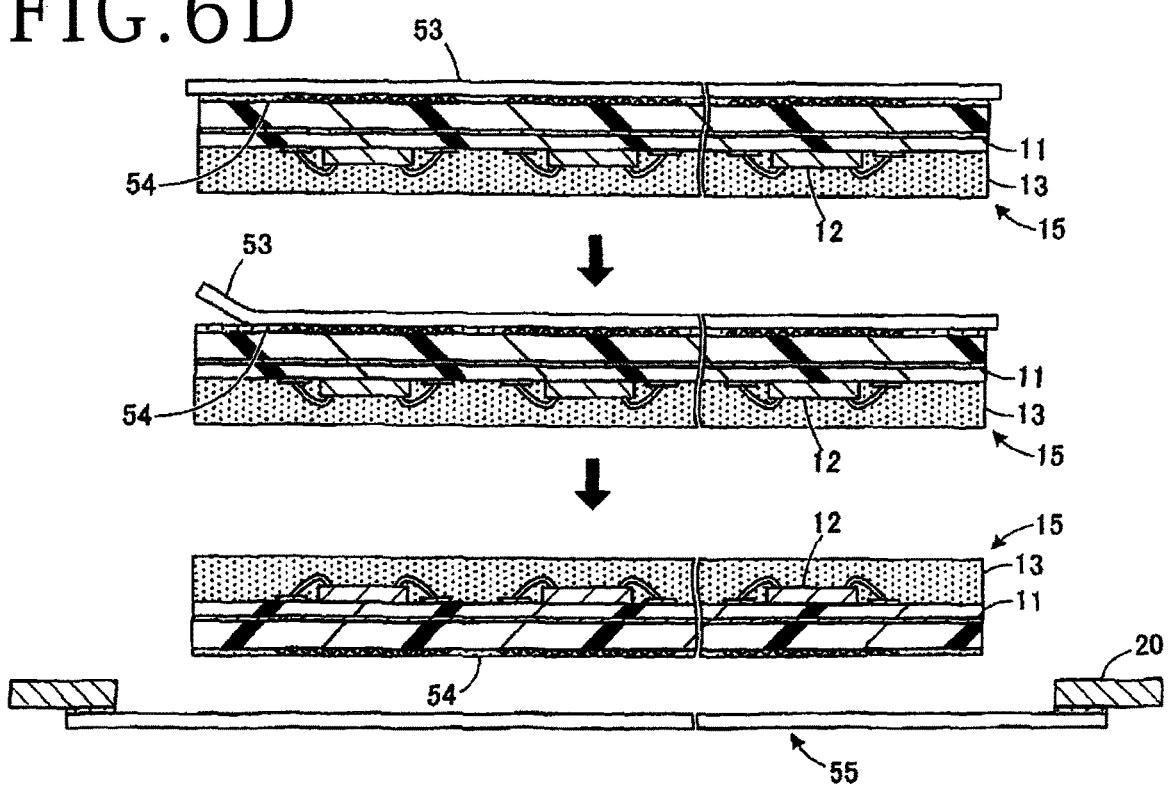

Note that as the protective tape 50, there may be used an integrated type tape having the tape base material 51 as well as the adhesive layers 52 and 54 in an integral form, as depicted in FIG. 6B, or a lamination type tape wherein the adhesive layers 52 and 54 are added to the tape base material 51, as depicted in FIG. 6C. In the case of the lamination type tape, the adhesive layers 52 and 54 are transferred from a release paper 53 onto the tape base material 51, to form the protective tape 50. Besides, as depicted in FIG. 6D, an adhesive layer 54 may be transferred from a release paper 53 onto the package substrate 15, and the package substrate 15 with the adhesive layer 54 may be adhered to a non-adhesive region of a protective tape 55. By these configurations, also, adhesion of the metallic powder 29 to the tape can be prevented.

In addition, the protective tape 50 need only have a configuration wherein adhesive regions are provided on an upper surface of the tape base material 51 in the areas of an outer peripheral part to be supported by the annular frame 20 and a central part to which the package substrate 15 is to be adhered, and a non-adhesive region is provided in other area than the areas of the outer peripheral part and the central part. Here, the non-adhesive region is not limited to a completely adhesiveness-free region, but may be a region where adhesiveness is reduced to such a level that the metallic powder 29 does not adhere thereto. Specifically, the adhesive region is a region where adhesiveness to the metallic powder 29 is higher at least than at the non-adhesive region, and the non-adhesive region is a region where adhesiveness to the metallic powder 29 is lower at least than at the adhesive region.

Thus, in the second processing method, the protective tape 50 wherein the adhesive layer is absent in the surroundings of the package substrate 15 is used, whereby adhesion of the metallic powder 29 to the protective tape 50 is restrained. Therefore, like in the first processing method, abnormal electric discharge in the shield layer forming step is prevented. In addition, since the protective tape 50 has resistance to a plasma treatment, deterioration of the protective tape 50 in the shield layer forming step is restrained, and the same protective tape 50 can be used in the series of treatments in the processing method for the package substrate 15.

Figure 7A:
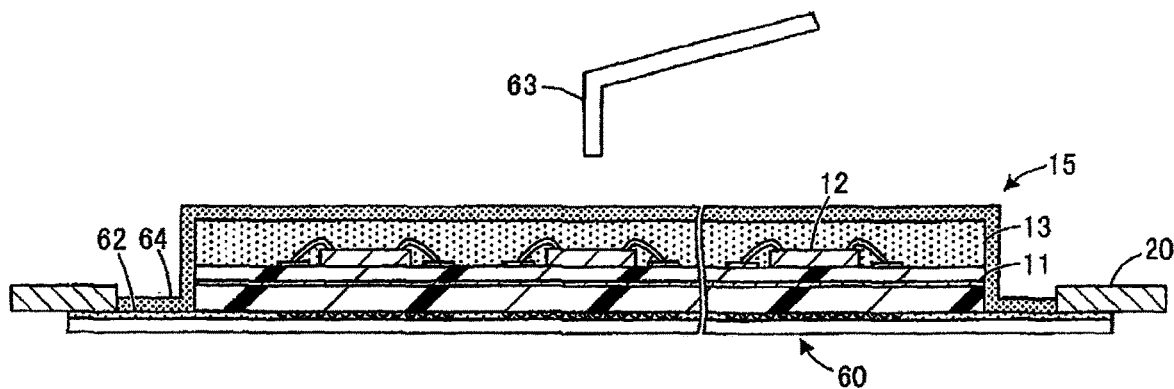
FIGS. 7A, 7B, and 7C are illustrations of a third package substrate processing method.
Figure 7B:
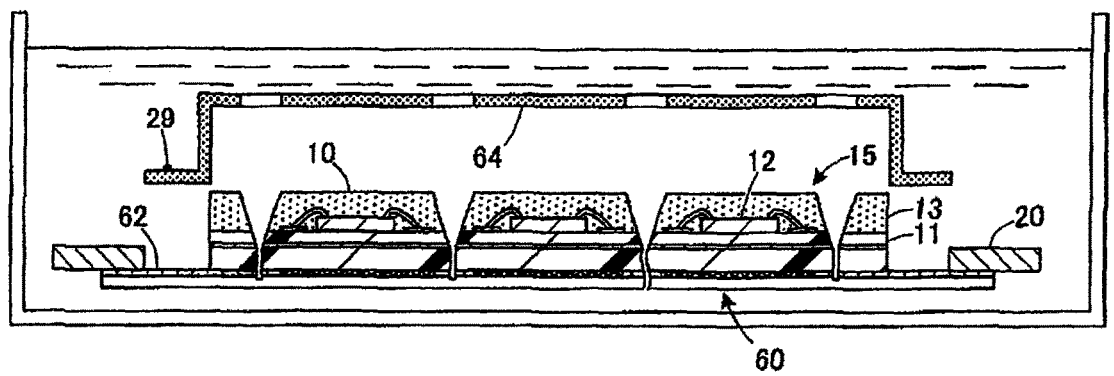
Figure 7C:
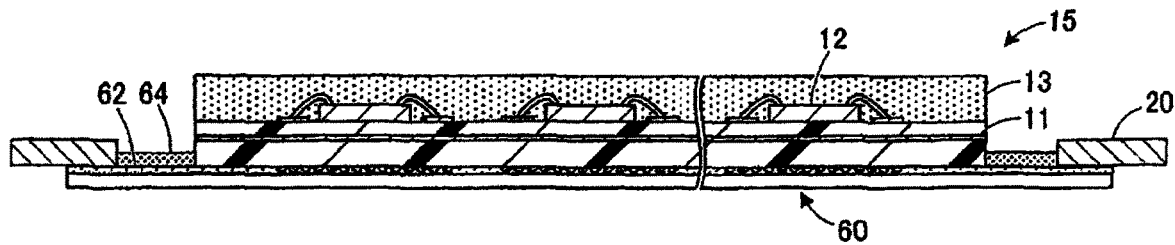

Referring to FIGS. 7A to 7C, a third processing method wherein a soft mask forming method is adopted will be described below. The third processing method differs from the first processing method only in that a water-soluble resin applying step and a water-soluble resin removing step are performed in place of the UV ray application step. Therefore, other steps than the UV ray applying step are the same as in the first processing method; therefore, descriptions of the other steps will be omitted, and the water-soluble resin applying step and the water-soluble resin removing step constituting the different point will be described. FIGS. 7A, 7B, and 7C are illustrations of the third package substrate processing method.

After the package substrate supporting step is performed, a water-soluble resin applying step is carried out, as illustrated in FIG. 7A. In the water-soluble resin applying step, the package substrate 15 is mounted on a spinner table (not depicted), and a nozzle 63 is positioned on the upper side of the package substrate 15. While the package substrate 15 is being rotated, a water-soluble resin is dropped from the nozzle 63, whereby the water-soluble resin is spread over exposed parts of the package substrate 15 and the protective tape 60 by centrifugal forces. As a result, the water-soluble resin is applied such as to cover the entire surface of the adhesive layer 62 of the protective tape 60 in the periphery of the package substrate 15.

Then, the water-soluble resin is cured, whereby a soft mask 64 is formed on the protective tape 60 in the surroundings of the package substrate 15. As the water-soluble resin, there may be used, for example, a UV-curing hot water swellable type one which is available from ThreeBond Co., Ltd. under the tradename of "30Y-632D-3." This water-soluble resin cures when irradiated with UV rays, and swells when immersed in hot water at around 90 degrees. Therefore, even when cleaning water at around 20 degrees is blown to the soft mask 64 in the V-groove forming step and/or the dividing step to be conducted subsequently, the soft mask 64 would not be exfoliated from the protective tape 60 during the processing.

After the dividing step is conducted, a water-soluble resin removing step is carried out, as illustrated in FIG. 7B. In the water-soluble resin removing step, the package substrate 15 is immersed in hot water, and the soft mask 64 (water-soluble resin) is removed through swelling. In this instance, the metallic powder 29 adhered to the soft mask 64 is also removed together with the soft mask 64, and, therefore, the metallic powder 29 would not remain on the protective tape 60. In addition, in the water-soluble resin removing step, the soft mask 64 may be removed by blowing hot water thereto, if the soft mask 64 can thereby be removed from the package substrate 15 and the protective tape 60.

Note that as illustrated in FIG. 7C, in the water-soluble resin applying step, it is only necessary to cover at least the whole part of the adhesive layer 62 of the protective tape 60 in the periphery of the package substrate 15, and the water-soluble resin may be applied only to the exposed part between the annular frame 20 and the package substrate 15. In this case, by applying the water-soluble resin while masking the package substrate 15 by a hard mask, the water-soluble resin can be applied only to the exposed part of the protective tape 60. Besides, the configuration wherein the water-soluble resin is applied by the spin coating method is not restrictive, and the application may be conducted by a spray coating method, an ink jet method, or a screen printing method.

Thus, in the third processing method, the soft mask 64 is formed in the surroundings of the package substrate 15 by use of the water-soluble resin, whereby adhesion of the metallic powder 29 to the exposed part of the protective tape 60 is prevented. Therefore, like in the first and second processing methods, abnormal electric discharge is prevented from occurring in the shield layer forming step. In addition, since the protective tape 60 has resistance to a plasma treatment, deterioration of the protective tape 60 in the shield layer forming step is restrained, and the same protective tape 60 can be used in the series of treatments in the processing method for the package substrate 15.

Figure 8:
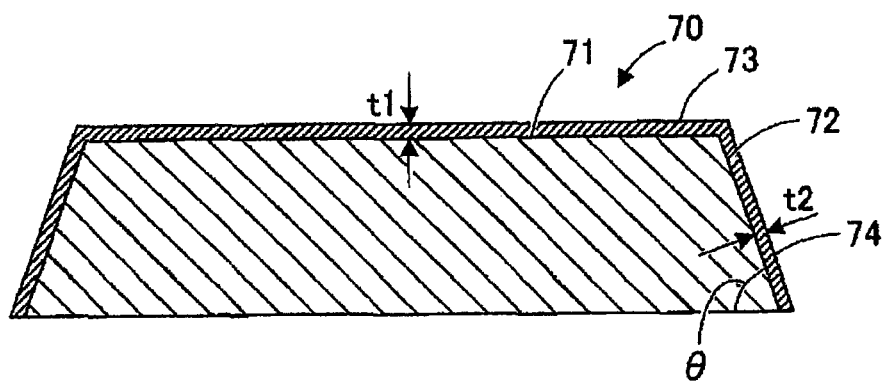
FIG. 8 is a figure depicting the thickness of a shield layer provided on a specimen.
Figure 9:
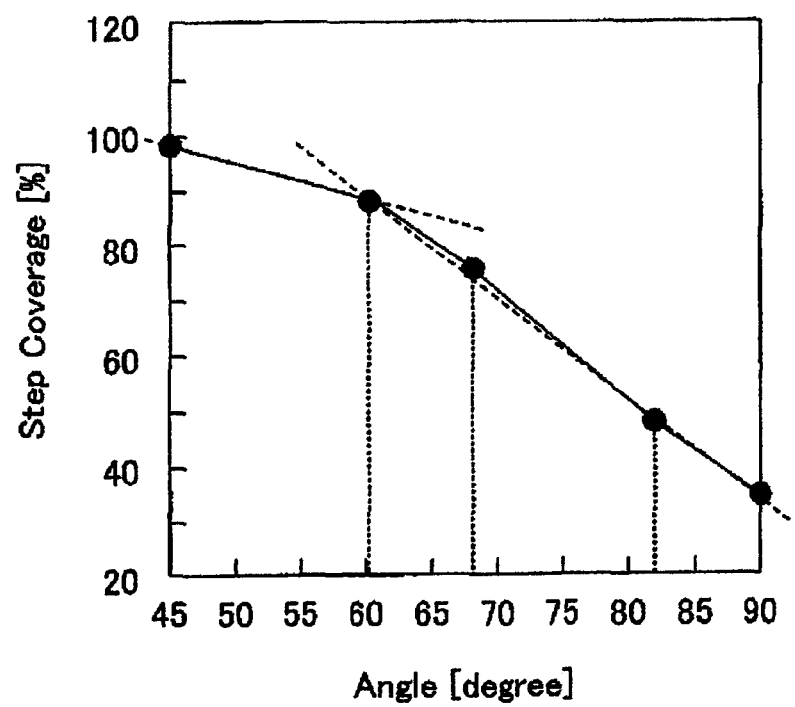
FIG. 9 is a diagram depicting a relation between the inclination angle of a side surface of a specimen and the thickness of a shield layer.

Now, a relationship between the inclination angle of side surfaces of the semiconductor package and the thickness of the shield layer will be described below. FIG. 8 is a figure depicting the thickness of a shield layer provided on a specimen. FIG. 9 is a diagram depicting a relation between the inclination angle of the side surface of the specimen and the thickness of the shield layer.

As illustrated in FIG. 8, a plurality of specimens 70 varied in the inclination angle $\theta$ of a side surface 72 were prepared, and a shield layer was formed on each of them by an ion plating method under the conditions of 180° C. and 8×10⁻⁴ Pa. The inclination angle θ of the side surface 72 was individually set to 90°, 82°, 68°, 60°, and 45°. In addition, for an upper shield layer 73 formed on an upper surface 71 and for a side shield layer 74 formed on the side surface 72, measurement of thicknesses t1 and t2 of the upper shield layer 73 and the side shield layer 74 was conducted based on observation images obtained by a scanning electron microscope. The thicknesses t1 and t2 of the upper shield layer 73 and the side shield layer 74 were used to calculate the value of step coverage represented by the following formula (1), and the relation between the value and the inclination angle θ was summarized in FIG. 9.

$$\text{Step coverage} = (t2/t1) \times 100 \tag{1}$$

As a result, the value of step coverage gradually increased as the inclination angle θ decreased from 90°, and the value of step coverage was 100% when the inclination angle θ was 45°. Specifically, in the case where the inclination angle θ was set to 45°, the thickness t1 of the upper shield layer 73 and the thickness t2 of the side shield layer 74 coincided with each other, and the shield layer in a uniform thickness was confirmed on the upper surface 71 and the side surface 72 of the specimen 70. Besides, according to the present inventors' experiment, when the value of step coverage is below 50%, considerable time is required for film formation for the side shield layer 74, and process cost increases; therefore, a value of step coverage in the range of not less than 50% is preferable. For this reason, the inclination angle θ of the side surface of the semiconductor package is preferably in the range of 45° to 82°.

As described above, according to the processing methods for the package substrate 15 according to the present embodiment, the adhesiveness of the protective tape 30, 50, or 60 in the periphery of the package substrate 15 is reduced or eliminated, and, therefore, adhesion of the metallic powder 29 to the protective tape 30, 50, or 60 in the periphery of the package substrate 15 is reduced, even when the metallic powder 29 of the wiring board 11 scatters at the time of dividing the semiconductor packages 10. When forming the shield layer 16 by the plasma treatment, generation of abnormal electric discharge due to the metallic powder 29 remaining on the protective tape 30, 50, or 60 is restrained. Therefore, the formation of the shield layer 16 is not hampered by abnormal electric discharge, and the shield layer 16 can be formed in a favorable manner.

Figure 10A:
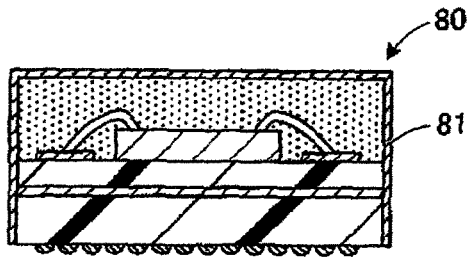
FIGS. 10A, 10B, and 10C are figures depicting a modification of the semiconductor package.

Note that a configuration wherein the dividing step is conducted after the V-groove forming step is applied to the package substrate has been adopted in the present embodiment, the dividing step may be carried out without performing the V-groove forming step. In other words, package side surfaces of each semiconductor package 80 may be vertical surfaces 81, as depicted in FIG. 10A.

Figure 10C:
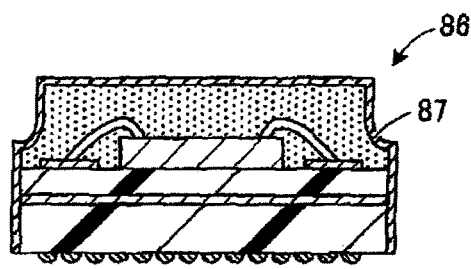
Figure 10B:
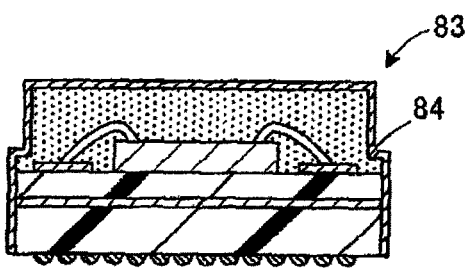

In addition, while a configuration wherein the package side surfaces of each semiconductor package were inclined due to the V-grooves has been adopted in the present embodiment, this configuration is not limitative. The package side surfaces of each semiconductor package 83 may each be provided with a step 84, as depicted in FIG. 10B, or the package side surfaces of each semiconductor package 86 may each be provided with a curved surface 87, as illustrated in FIG. 10C.

Figure 11A:
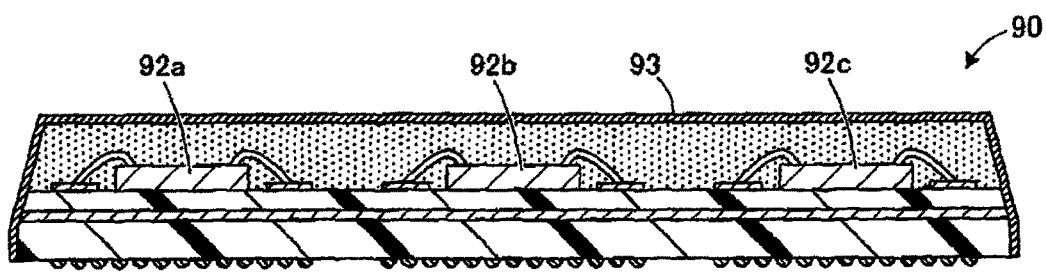
FIGS. 11A and 11B are figures depicting a modification of the semiconductor package.

In addition, while a semiconductor package in which a single semiconductor chip is mounted on a wiring board has been depicted as an example in the present embodiment, this configuration is not restrictive. A semiconductor package in which a plurality of semiconductor chips are mounted on a wiring board may also be manufactured. For example, as depicted in FIG. 11A, a semiconductor package 90 wherein a plurality of (for example, three) semiconductor chips 92a, 92b, and 92c are mounted on a wiring board 91 and the semiconductor chips 92a, 92b, and 92c are collectively shielded may be manufactured. In this case, the package substrate is formed with V-grooves on a package basis, and the semiconductor package substrate is divided on the package basis. Note that the semiconductor chips 92a, 92b, and 92c may have the same function or may have different functions.

Figure 11B:
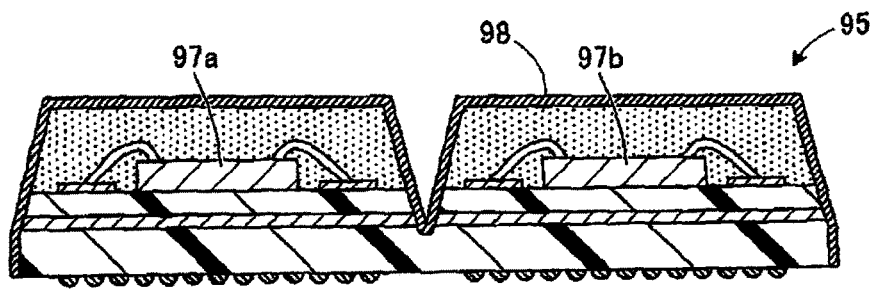

Besides, a semiconductor package 95 wherein a plurality of (for example, two) semiconductor chips 97a and 97b are mounted on a wiring board and the semiconductor chips 97a and 97b are individually shielded, as depicted in FIG. 11B, may be manufactured. In this case, the package substrate is formed with V-grooves on a chip basis, and the package substrate is divided on a package basis. Note that the semiconductor chips 97a and 97b may have the same function, or may have different functions.

Figure 12:
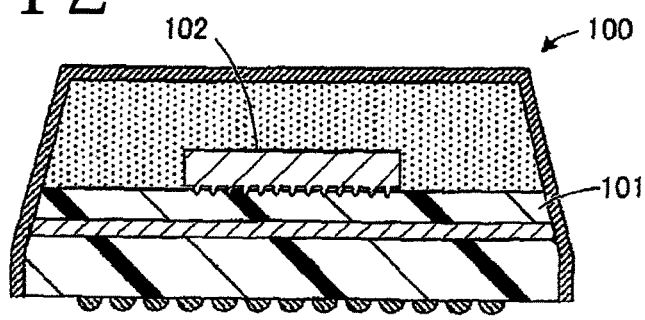
FIG. 12 is a figure depicting a modification of the semiconductor package.

In addition, while a configuration of manufacturing a semiconductor package in which a semiconductor chip is connected to electrodes of a wiring board by wire bonding through wires has been described in the present embodiment, this configuration is not restrictive. As depicted in FIG. 12, flip-chip bonding wherein a semiconductor chip 102 is connected directly to electrodes of a wiring board 101 may be adopted to a semiconductor package 100.

Figure 13A:
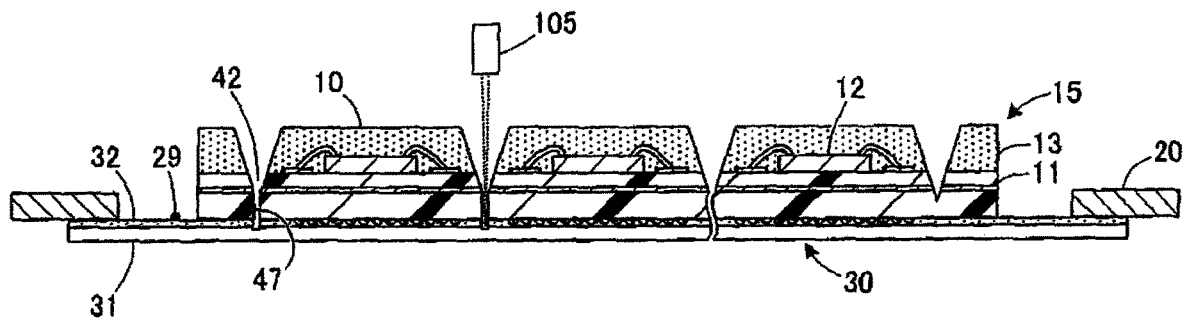
FIGS. 13A and 13B are figures depicting a modification of a dividing step.
Figure 13B:
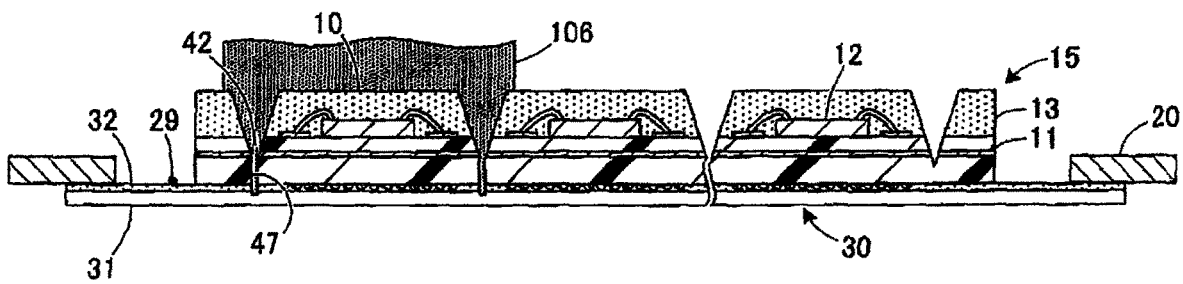

Besides, while a configuration wherein a straight blade is used in the dividing step has been depicted in the present embodiment, this configuration is not limitative. For example, as illustrated in FIG. 13A, the package substrate 15 may be divided by use of a processing head 105 for laser ablation as a dividing tool. In addition, as illustrated in FIG. 13B, the package substrate 15 may simultaneously be formed with V-grooves and be divided by use of a formed grindstone 106 as a dividing tool. Besides, a multi-blade may be used in place of the formed grindstone 106.

In addition, in the present embodiment, the formation of the semiconductor package substrate with V-grooves and the dividing of the semiconductor package substrate may be performed by the same apparatus, or may be carried out by different apparatuses.

Besides, the configuration wherein the semiconductor package is used for portable communication apparatuses such as mobile phones is not restrictive, and the semiconductor package may be used for other electronic apparatuses such as cameras.

In addition, the package substrate is not particularly restricted, provided that the package substrate is a workpiece capable of being formed with a shield layer. For example, various substrates for chip size package (CSP), wafer level chip size package (WLCSP), EMI, system in package (SIP), a fan out wafer level package (FOWLP) may be used. In the case of a FOWLP substrate, a plurality of chips differing in thickness may be mounted on a rewiring layer. Therefore, the wiring substrate is not limited to wiring boards such as printed circuit board (PCB) substrate, but may be the rewiring layer of a FOWLP substrate.

Besides, while the present embodiment and modifications have been described, entire or partial combinations of each embodiment and modifications may be used as other embodiments of the present invention.

In addition, the embodiments of the present invention are not limited to the above embodiment and modifications, and various changes, replacements and/or modifications may be made without departing from the gist of the technical thought of the invention. Further, if the technical thought of the present invention can be realized in other ways by the progress of technology or by other derivative technologies, the invention may be carried out by the other relevant method. Therefore, the scope of the claims covers all the embodiments that are included in the scope of the technical thought of the present invention.

Besides, while a configuration wherein the present invention is applied to a package substrate processing method has been described in the present embodiment, the invention is also applicable to processing methods for other objects of processing which are to be formed with a shield layer.

As has been described above, the present invention has effects of restraining adhesion of a metallic powder to a protective tape, and preventing the generation of abnormal electric discharge in a plasma treatment, and the invention is especially useful for a processing method for a package substrate to be used in portable communication apparatuses.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A package substrate processing method for processing a package substrate having a plurality of chips in regions partitioned by intersecting division lines formed on a wiring substrate, the chips collectively sealed with a sealing agent, the package substrate processing method comprising:
    a package substrate supporting step of adhering a protective tape to the wiring substrate side of the package substrate and supporting a peripheral portion of the protective tape by an annular frame;
    a dividing step of cutting into an intermediate portion of the protective tape by a dividing tool, processing the package substrate along the division lines, and dividing the package substrate into individual semiconductor packages so that each of said semiconductor packages includes an upper surface, inclined side surfaces extending from said upper surface, and vertical surfaces extending from said inclined side surfaces, and defines a groove between said vertical surfaces of adjacent semiconductor packages, after the package substrate supporting step is performed; and
    a shield layer forming step of forming a conductive shield layer on said upper surface, said inclined side surfaces and said vertical surfaces of each of the plurality of semiconductor packages and on a bottom of each of said grooves between the adjacent semiconductor packages, after the dividing step is performed,
    wherein, in said shield layer forming step, a thickness of said conductive shield layer on a portion of said vertical surfaces is less than a thickness of said conductive shield layer on said inclined surfaces and said upper surface of each of the plurality of semiconductor packages, and
    wherein, in the dividing step, processing is conducted by the dividing tool in a state in which adhesiveness of an adhesive layer of the protective tape in a periphery of the package substrate is reduced or eliminated, whereby adhesion of a metallic powder of the wiring substrate scattering at the time of the dividing to the adhesive layer of the protective tape is reduced.

2. The package substrate processing method according to claim 1, further comprising:
    a V-groove forming step of holding the protective tape side of the package substrate by a chuck table, causing a cutting blade having a V-shaped tip to cut from a side of the sealing agent to an intermediate position in a thickness direction of the package substrate, to cut the package substrate along regions corresponding to the division lines, thereby forming V-grooves to form said inclined side surfaces from said upper surface of the sealing agent to said bottom of each cut groove, between the package substrate supporting step and the dividing step.

3. The package substrate processing method according to claim 2, further comprising:
    a rectangular groove forming step of forming a rectangular groove in a groove bottom of each of said V-grooves.

4. The package substrate processing method according to claim 1, further comprising:
    a V-groove forming step of holding the protective tape side of the package substrate by a chuck table, causing a cutting blade having a V-shaped tip to cut from a side of the sealing agent to an intermediate position in a thickness direction of the package substrate, to cut the package substrate along regions corresponding to the division lines, thereby forming V-grooves to form said inclined side surfaces from said upper surface of the sealing agent to said bottom of each cut groove, between the package substrate supporting step and the dividing step.

5. The package substrate processing method according to claim 4, further comprising:
    a rectangular groove forming step of forming a rectangular groove in a groove bottom of each of said V-grooves.

6. A package substrate processing method for processing a package substrate having a plurality of chips in regions partitioned by intersecting division lines formed on a wiring substrate, the chips collectively sealed with a sealing agent, the package substrate processing method comprising:
    a package substrate supporting step of adhering a protective tape to the wiring substrate side of the package substrate and supporting a peripheral portion of the protective tape by an annular frame;
    a dividing step of cutting into an intermediate portion of the protective tape by a dividing tool, processing the package substrate along the division lines, and dividing the package substrate into individual semiconductor packages so that each of said semiconductor packages includes an upper surface, inclined side surfaces extending from said upper surface, and vertical surfaces extending from said inclined side surfaces, and a groove is formed between said vertical surfaces of adjacent semiconductor packages, after the package substrate supporting step is performed;
    a shield layer forming step of forming a conductive shield layer on said upper surface, said inclined side surfaces and said vertical surfaces of each of the plurality of semiconductor packages and on a bottom of each of said grooves between the adjacent semiconductor packages, after the dividing step is performed; and
    an ultraviolet ray applying step of applying ultraviolet rays to the adhesive tape exposed in the periphery of the package substrate, to reduce adhesion of the metallic powder to an adhesive layer of the protective tape in the periphery of the package substrate, between the package substrate supporting step and the dividing step, wherein, in the dividing step, processing is conducted by the dividing tool in a state in which adhesiveness of the adhesive layer of the protective tape in a periphery of the package substrate is reduced or eliminated, whereby adhesion of a metallic powder of the wiring substrate scattering at the time of the dividing to the adhesive layer of the protective tape is reduced.

7. The package substrate processing method according to claim 6, further comprising:
a V-groove forming step of holding the protective tape side of the package substrate by a chuck table, causing a cutting blade having a V-shaped tip to cut from a side of the sealing agent to an intermediate position in a thickness direction of the package substrate, to cut the package substrate along regions corresponding to the division lines, thereby forming V-grooves to form said inclined side surfaces from said upper surface of the sealing agent to said bottom of each cut groove, between the package substrate supporting step and the dividing step.

8. The package substrate processing method according to claim 6, wherein, in said shield layer forming step, a thickness of said conductive shield layer on a portion of said vertical surfaces is less than a thickness of said conductive shield layer on said inclined surfaces and said upper surface of each of the plurality of semiconductor packages.

9. A package substrate processing method for processing a package substrate having a plurality of chips in regions partitioned by intersecting division lines formed on a wiring substrate, the chips collectively sealed with a sealing agent, the package substrate processing method comprising:
a package substrate supporting step of adhering a protective tape to the wiring substrate side of the package substrate and supporting a peripheral portion of the protective tape by an annular frame;
a dividing step of cutting into an intermediate portion of the protective tape by a dividing tool, processing the package substrate along the division lines, and dividing the package substrate into individual semiconductor packages so that each of said semiconductor packages includes an upper surface, inclined side surfaces extending from said upper surface, and vertical surfaces extending from said inclined side surfaces, and a groove is formed between said vertical surfaces of adjacent semiconductor packages, after the package substrate supporting step is performed; and
a shield layer forming step of forming a conductive shield layer on said upper surface, said inclined side surfaces and said vertical surfaces of each of the plurality of semiconductor packages and on a bottom of each of said grooves between the adjacent semiconductor packages, after the dividing step is performed,
wherein, in the dividing step, processing is conducted by the dividing tool in a state in which adhesiveness of an adhesive layer of the protective tape in a periphery of the package substrate is reduced or eliminated, whereby adhesion of a metallic powder of the wiring substrate scattering at the time of the dividing to the adhesive layer of the protective tape is reduced, and
wherein the protective tape has the adhesive layer only at parts to be adhered to the package substrate and the annular frame in the periphery.

10. The package substrate processing method according to claim 9, further comprising:
a V-groove forming step of holding the protective tape side of the package substrate by a chuck table, causing a cutting blade having a V-shaped tip to cut from a side of the sealing agent to an intermediate position in a thickness direction of the package substrate, to cut the package substrate along regions corresponding to the division lines, thereby forming V-grooves to form said inclined side surfaces from said upper surface of the sealing agent to said bottom of each cut groove, between the package substrate supporting step and the dividing step.

11. The package substrate processing method according to claim 9, wherein, in said shield layer forming step, a thickness of said conductive shield layer on a portion of said vertical surfaces is less than a thickness of said conductive shield layer on said inclined surfaces and said upper surface of each of the plurality of semiconductor packages.

12. A package substrate processing method for processing a package substrate having a plurality of chips in regions partitioned by intersecting division lines formed on a wiring substrate, the chips collectively sealed with a sealing agent, the package substrate processing method comprising:
a package substrate supporting step of adhering a protective tape to the wiring substrate side of the package substrate and supporting a peripheral portion of the protective tape by an annular frame;
a dividing step of cutting into an intermediate portion of the protective tape by a dividing tool, processing the package substrate along the division lines, and dividing the package substrate into individual semiconductor packages so that each of said semiconductor packages includes an upper surface, inclined side surfaces extending from said upper surface, vertical surfaces extending from said inclined side surfaces, and a groove is formed between said vertical surfaces of adjacent semiconductor packages, after the package substrate supporting step is performed;
a shield layer forming step of forming a conductive shield layer on said upper surface, said inclined side surfaces and said vertical surfaces of each of the plurality of semiconductor packages and on a bottom of each of said grooves between the adjacent semiconductor packages, after the dividing step is performed; and
a water-soluble resin applying step of applying a water-soluble resin in such a manner as to cover at least an entire surface of an adhesive layer of the protective tape in the periphery of the package substrate, between the package substrate supporting step and the dividing step; and
a water-soluble resin removing step of removing the water-soluble resin, after the dividing step is performed,
wherein, in the dividing step, processing is conducted by the dividing tool in a state in which adhesiveness of the adhesive layer of the protective tape in a periphery of the package substrate is reduced or eliminated, whereby adhesion of a metallic powder of the wiring substrate scattering at the time of the dividing to the adhesive layer of the protective tape is reduced.

13. The package substrate processing method according to claim 12, further comprising:
a V-groove forming step of holding the protective tape side of the package substrate by a chuck table, causing a cutting blade having a V-shaped tip to cut from a side of the sealing agent to an intermediate position in a thickness direction of the package substrate, to cut the package substrate along regions corresponding to the division lines, thereby forming V-grooves to form said inclined side surfaces from said upper surface of the sealing agent to said bottom of each cut groove, between the package substrate supporting step and the dividing step.

14. The package substrate processing method according to claim 12, wherein, in said shield layer forming step, a thickness of said conductive shield layer on a portion of said vertical surfaces is less than a thickness of said conductive shield layer on said inclined surfaces and said upper surface of each of the plurality of semiconductor packages.

* * * * *